United States Patent [19]

Fukuoka et al.

[11] Patent Number: 5,183,500

[45] Date of Patent: Feb. 2, 1993

[54] ELECTROLESS PLATING BATH COMPOSITION AND METHOD FOR PRODUCTION THEREOF

[75] Inventors: Kazuhiro Fukuoka, Matsudo; Keiki Kiyohara, Gokamura; Tadayuki Konishi; Isao Miyatake, both of Tokyo; Masaji Hamamoto, Osaka, all of Japan

[73] Assignee: Kosaku & Co., Ltd., Tokyo, Japan

[21] Appl. No.: 754,753

[22] Filed: Sep. 4, 1991

[30] Foreign Application Priority Data

Apr. 18, 1991 [JP] Japan .................................. 3-112183

[51] Int. Cl.$^5$ ............................................. C23C 18/54
[52] U.S. Cl. .................................. 106/1.22; 106/1.25
[58] Field of Search ........................... 106/1.22, 1.25; 205/254

[56] References Cited

U.S. PATENT DOCUMENTS

| | | | |
|---|---|---|---|
| 2,965,551 | 12/1960 | Richaud | 204/32 |
| 4,194,913 | 3/1980 | Davis | 106/1.22 |
| 4,263,106 | 4/1981 | Kohl | 204/435 |
| 4,715,894 | 12/1987 | Holtzman et al. | 106/1.22 |

Primary Examiner—William R. Dixon, Jr.
Assistant Examiner—Margaret Eismann
Attorney, Agent, or Firm—Oblon, Spivak, McClelland, Maier & Neustadt

[57] ABSTRACT

An electroless plating bath composition is produced by mixing stannous oxide, at least one member selected from the group consisting of lead oxide and lead perchlorate, perchloric acid, and thiourea. The composition thus obtained is ideal for electroless plating of a substrate of copper, particularly a substrate provided with a resist film.

2 Claims, 1 Drawing Sheet

ELECTROLESS PLATING BATH COMPOSITION AND METHOD FOR PRODUCTION THEREOF

BACKGROUND OF THE INVENTION

1. Field of the Invention

This invention relates to an electroless plating bath composition. More particularly, this invention relates to an electroless plating bath composition ideal for the electroless plating of an ordinary copper surface, a circuit pattern formed of copper, or exposed copper parts of a substrate provided with a resist film of an organic compound, and to a method for the production of the composition.

2. Prior Art Statement

When a substrate covered with a resist film is plated using the conventional electroless plating bath composition such as, for example, a hydrochloride bath composed mainly of hydrochloric acid, stannous chloride, and lead chloride, a borofluoride bath composed mainly of borofluoric acid, stannous borofluoride, and lead borofluoride, or a toluene-sulfonate bath composed mainly of toluene-sulfonic acid, stannous toluene-sulfonate, and lead toluene-sulfonate, the plating operation is liable to entail such detrimental phenomena as dissolution and filtration of the resist film with the plating solution and infiltration of the undercut part in the resist film. As a result, the film sometimes separates from the substrate. It is, therefore, extremely difficult to form a sharp pattern with the conventional electroless plating bath composition.

One object of the resist film resides in protecting the circuit pattern. The adverse phenomena mentioned above prevent this object from being attained. Further, the dissolution of the resist film into the plating bath degrades the quality of the plating bath and shortens its service life.

SUMMARY OF THE INVENTION

The present inventors continued various studies in search of a solution of the aforesaid problems encountered when the conventional electroless plating bath is used for plating printed substrates. As a result, they have accomplished this invention.

Specifically, the present invention is directed to an electroless plating bath composition produced by mixing stannous oxide and at least one member selected from the group consisting of lead oxide and lead perchlorate as the raw material for the formation of a plating film with, perchloric acid and thiourea, and a method for the production of an electroless plating bath composition essentially consisting of mixing stannous oxide with at least one member selected from the group consisting of lead oxide and lead perchlorate, perchloric acid, and thiourea.

The above and other objects and features of the invention will become apparent from the following detailed description with reference to the accompanying drawing.

BRIEF DESCRIPTION OF THE DRAWING

Drawing represents a surface of an IPC test board used in Examples and Comparative Experiments.

DESCRIPTION OF THE PREFERRED EMBODIMENT

Figure 1:
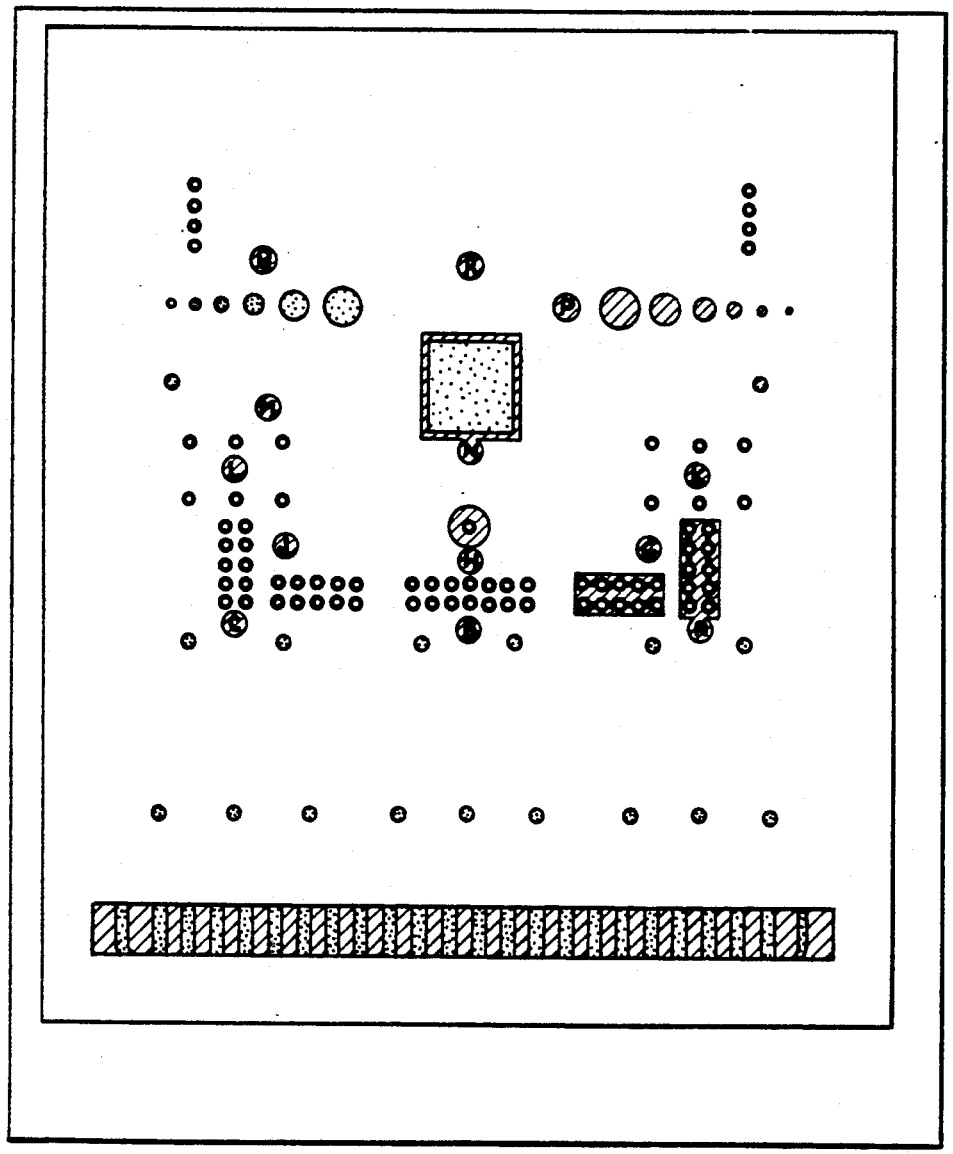

The electroless plating bath composition using stannous oxide as the source of tin has no possibility of giving rise to a product of low solubility which would occur in the conventional electroless plating using tin chloride as a typical raw material for tin. More specifically, there is no possibility of a precipitate forming in the plating bath when its temperature falls owing to the immersion of a substrate to be plated therein. Further, there is no possibility of the electroless plating bath forming an inferior plating on the substrate.

Since the perchloric acid compounds of tin and lead are themselves soluble, differently from the conventional plating bath, the plating bath of the present invention does not require the presence therein of a powerful complex ion forming agent and does not require the available metal concentrations therein to be extremely heightened to afford sufficient plating. The plating bath has no possibility of producing a defective plating because the metals are contained therein in the form of simple ions. Moreover, the metal concentrations in the bath may be easily heightened as required. As a result, the coating surface area per unit volume of the bath is large, the service life of the bath is markedly prolonged and the speed of coating formation increased.

It is necessary to add stannous oxide to the bath in such amount as to be present therein as tin at a concentration of 6-22 g/l and lead oxide and lead perchlorate thereto in such amount as to be present therein as lead at a concentration of 8-30 g/l.

The bath composition of the present invention is characterized by further containing perchloric acid and thiourea.

The content of perchloric acid as perchloric acid is in the range of 19-58 g/l.

The amount of perchloric acid to be added includes the amount of the perchloric acid which is formed in the bath in consequence of the addition thereto of lead perchlorate.

If the content of the perchloric acid is less than the lower limit of the range, the bath becomes opaque or hydrolyzes. Conversely, if this content is larger than the upper limit of the range, the thiourea as one component of the composition undergoes accelerated oxidative decomposition and consequently the bath suffers from the occurrence of a sulfide. Thus, the life of plating bath becomes short and the coat produced by plating becomes rough. Further, the alloy coat formed by the plating is redissolved and the plating bath acidity becomes unduly high, with the result that the speed of formation of the coat is lowered and the proportion of tin in the formed coat in increased.

If the concentration of the tin compound is less than that mentioned above, rustproofing of the copper substrate is not attained because the tin content of the alloy is unduly small and the surface of the coat formed by plating is coarse. If the concentration is higher than the specified range, the tin content in the coat formed by plating is unduly large.

The amount of lead oxide and/or lead perchlorate as metallic lead is desired to be in the range of from 8 g/l to 30 g/l. Any deviation of the concentration of lead oxide and/or lead perchlorate from the range mentioned above is undesirable because the proportion of tin in the alloy coat to be formed by plating becomes unduly large if the concentration is less than the lower limit of the range and the proportion of lead in the alloy coat becomes unduly large, the surface of the coat becomes coarse, the adhesion of the coat to the substrate becomes inferior, the melting point of the alloy becomes high, and the soldering property essential for the formation of the alloy coat is seriously impaired if the concentration is high.

The concentration of thiourea is desired to be in the range of from 20 g/l to 70 g/l. Any deviation of the concentration of thiourea from this range is undesirable because the speed of formation of the coat is lowered if the concentration is low and the proportion of tin in the alloy coat is increased and the speed of deposition is sharply decreased if the concentration is high.

In the plating bath composition of this invention, tin and lead are present in the form of perchlorates.

Now, the effect of the present invention will be described in detail below with reference to working examples and comparative experiments.

EXAMPLES 1 TO 23

(1) Substrate to be coated

An IPC test board measuring 135 mm in length and 125 mm in width and having only the surface thereof illustrated in the drawing was used. In the drawing, the black portions are exposed copper (i.e. the plated portions), the hatched portions are the plastic substrate and the remaining portions are resist film. The portions resembling block doughnuts are through-holes passing through the interior.

The resist film was produced by solidifying a photographic development type liquid resist (produced by San'ei Kagaku Kabushiki Kaisha) and a thermosetting type solder resist (produced by San'ei Kagaku Kabushiki Kaisha).

(2) Method for electroless plating

The test board described above was subjected to a pretreatment using the following procedure.
1) Acidic defatting by immersion in citric acid at 40° C. for one minute
2) Washing with water
3) Soft etching by immersion in an aqueous 10% sodium persulfate solution for two minutes
4) Washing with water
5) Activation by immersion in an aqueous 3% $H_2SO_4$ solution
6) Washing with water The opposite surface of test boards which had undergone the pretreatment described above were subjected to electroless plating with the different bath compositions indicated in Table 1 and Table 2. The test board which had undergone the electroless plating was washed with water, washed with hot water, and dried with hot air. (3) The printed substrate obtained by the electroless plating described above was subjected to the various tests indicated below. The results are shown in Table 1 and Table 2.

(a) Test of coat formed by plating
1. The thickness and the alloy composition of the coat were determined by the fluorescent X-ray method.
2. The dissolvability of the coat was determined by retaining the sample in an infrared ray furnace at 190° C. to 395° C. for 40 seconds and rating the degree of dissolution on a three-level scale, wherein o stands for complete dissolution, Δ for 40 to 60% dissolution, and x for complete absence of dissolution.

(b) Test of the printed circuit board for short circuit on a two-level scale, wherein o stands for absence of short circuit and x for presence of short circuit.

(c) Resist test
1. Appearance rated on a three-level scale, wherein o stands for continued retention of the surface gloss of the resist coat after the plating, Δ for variation of the surface gloss of the resist coat after the plating, and x for complete loss of the surface gloss after the plating.
2. Tape peeling test was carried out by preparing tape containing 100 1-m squares, applying this tape to the printed surface, peeling the tape off the printed surface, and count the number of squares remaining on the printed surface. The result was rated on a three-level scale, wherein o stands for complete absence of separated resist film, Δ for partial separation of resist film, and x for substantially complete separation.
3. Hardness test performed by determination of pencil hardness.
4. Durability to resist solder was determined by immersing a given substrate for 30 seconds in a flow solder prepared by fusing 6.4 solder 15 260° C. thereby causing adhesion of the solder to the copper part of the substrate and subjecting the substrate to the same tape peeling test as described above, with the result rated on a two-level scale, wherein o stands for absence of peeling and x for presence of peeling.

TABLE 1

| Example No. | 1 | 2 | 3 | 4 | 5 | 6 | 7 | 8 | 9 | 10 | 11 | 12 |
|---|---|---|---|---|---|---|---|---|---|---|---|---|
| Plating bath composition | | | | | | | | | | | | |
| Stannous oxide (g/l) | 7 | 10 | 12 | 14 | 16 | 18 | 20 | 22 | 20 | 14 | 22 | 16 |
| As tin (g/l) | 6.2 | 8.8 | 10.6 | 12.3 | 14.1 | 15.8 | 17.6 | 19.4 | 17.6 | 12.3 | 19.4 | 14.1 |
| Lead oxide (g/l) | 9.28 | 13.92 | 16.24 | 18.56 | 22.04 | 24.36 | 26.68 | 30.16 | 24.36 | 26.68 | 18.56 | 13.92 |
| Lead perchlorate (g/l) | | | | | | | | | | | | |
| As lead (g/l) | 8 | 12 | 14 | 16 | 19 | 21 | 23 | 26 | 21 | 23 | 16 | 12 |
| Perchloric acid (g/l) | 19 | 25 | 30 | 35 | 40 | 48 | 50 | 58 | 48 | 35 | 50 | 50 |
| Perchloric acid component (g/l) | 19 | 25 | 30 | 35 | 40 | 48 | 50 | 58 | 48 | 35 | 50 | 50 |
| Thiourea (g/l) | 20 | 27 | 33 | 39 | 44 | 50 | 56 | 70 | 60 | 70 | 65 | 70 |
| Plating conditions | | | | | | | | | | | | |
| Temperature (°C.) | 65 | 65 | 65 | 70 | 70 | 75 | 70 | 65 | 60 | 60 | 65 | 65 |
| pH | 0.7 | 0.7 | 0.7 | 0.7 | 0.8 | 0.8 | 0.8 | 0.8 | 0.8 | 0.7 | 0.7 | 0.7 |
| Plating time (minutes) | 5 | 10 | 15 | 10 | 15 | 20 | 20 | 25 | 20 | 15 | 10 | 15 |
| Formed coat | | | | | | | | | | | | |
| Thickness (μm) | 3.5 | 4.9 | 6.5 | 5.2 | 6.7 | 7.4 | 7.8 | 8.2 | 4.7 | 6.1 | 4.2 | 6.5 |
| Tin ratio (%) | 59.3 | 60.5 | 62.4 | 62.6 | 66.6 | 65.6 | 68.3 | 62.9 | 57.6 | 56.2 | 66.1 | 64.1 |
| Dissolution test | c | c | c | c | c | c | c | o | o | c | c | c |
| Short circuit test | o | o | o | o | o | o | o | o | o | o | o | o |
| Resist test | | | | | | | | | | | | |
| Appearance | c | c | c | c | c | c | c | c | o | c | c | c |

TABLE 1-continued

| Example No. | 1 | 2 | 3 | 4 | 5 | 6 | 7 | 8 | 9 | 10 | 11 | 12 |
|---|---|---|---|---|---|---|---|---|---|---|---|---|
| Pencil hardness | 8H | 8H | 7H | 7H | 8H | 8H | 8H | 8H | 8H | 8H | 8H | 8H |
| Peel test | o | o | o | o | o | o | o | o | o | o | o | o |
| Durability to resist solder | o | o | o | o | o | o | o | o | o | o | o | o |
| Kind of resist | A | B | A | B | A | B | A | B | A | B | A | B |

A: Photographic development type liquid resist
B: Thermosetting type solder resist

TABLE 2

| Example No. | 13 | 14 | 15 | 16 | 17 | 18 | 19 | 20 | 21 | 22 | 23 |
|---|---|---|---|---|---|---|---|---|---|---|---|
| Plating bath composition | | | | | | | | | | | |
| Stannous oxide (g/l) | 7 | 10 | 11 | 11 | 12 | 14 | 14 | 16 | 18 | 20 | 22 |
| As tin (g/l) | 6.2 | 8.8 | 9.7 | 9.7 | 10.6 | 12.3 | 12.3 | 14.1 | 15.8 | 17.6 | 19.4 |
| Lead oxide (g/l) | | | | | | | | | | | |
| Lead perchlorate (g/l) | 15 | 20 | 25 | 30 | 35 | 40 | 45 | 50 | 55 | 60 | 65 |
| As lead (g/l) | 6.8 | 9.0 | 11.3 | 13.5 | 15.7 | 18.0 | 20.2 | 22.5 | 24.8 | 27.0 | 29.3 |
| Perchloric acid (g/l) | 20 | 20 | 23 | 23 | 23 | 30 | 30 | 30 | 30 | 30 | 30 |
| Perchloric acid component (g/l) | 26 | 29 | 33 | 36 | 40 | 47 | 49 | 52 | 57 | 50 | 58 |
| Thiourea (g/l) | 20 | 22 | 22 | 30 | 33 | 40 | 44 | 48 | 50 | 55 | 60 |
| Plating conditions | | | | | | | | | | | |
| Temperature (°C.) | 70 | 70 | 65 | 75 | 70 | 75 | 65 | 60 | 70 | 75 | 60 |
| pH | 0.8 | 0.8 | 0.8 | 0.7 | 0.7 | 0.8 | 0.8 | 0.8 | 0.7 | 0.8 | 0.8 |
| Plating time (minutes) | 10 | 10 | 10 | 15 | 15 | 15 | 20 | 20 | 20 | 25 | 25 |
| Formed coat | | | | | | | | | | | |
| Thickness (μm) | 5.2 | 4.8 | 5.4 | 6.7 | 6.3 | 6.9 | 7.1 | 7.9 | 7.1 | 8.9 | 9.1 |
| Tin ratio (%) | 58.4 | 60.6 | 62.1 | 67.3 | 65.4 | 65.5 | 63.7 | 59.9 | 68.4 | 67.2 | 61.4 |
| Dissolution test | o | o | o | o | o | o | o | o | o | o | o |
| Short circuit test | o | o | o | o | o | o | o | o | o | o | o |
| Resist test | | | | | | | | | | | |
| Appearance | o | o | o | o | o | o | o | o | o | o | o |
| Pencil hardness | 8H | 8H | 8H | 7H | 8H | 8H | 7H | 8H | 8H | 8H | 8H |
| Peel test | o | o | o | o | o | o | o | o | o | o | o |
| Durability to resist solder | o | o | o | o | o | o | o | o | o | o | o |
| Kind of resist | A | B | A | B | A | B | A | B | A | B | A |

A: Photographic development type liquid resist
B: Thermosetting type solder resist

COMPARATIVE EXPERIMENTS 1 TO 14

The same printed substrate as used in the aforementioned examples was subjected to electroless plating using various electroless plating bath composition having the same components as those of the present invention, but deviating in their concentrations from the ranges of the present invention. The coat consequently formed was subjected to the same tests as those of the working examples cited above. The plating bath compositions, the plating conditions, the formed coats, and the test results are shown in Table 3.

TABLE 3

| Comparative Experiment No. | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Plating bath composition | | | | | | | | | | | | | | |
| Stannous oxide (g/l) | 6 | 4 | 6 | 38 | 41 | 36 | 30 | 28 | 4 | 38 | 6 | 40 | 40 | 48 |
| As tin (g/l) | 5.3 | 3.5 | 5.3 | 33.4 | 36.1 | 31.7 | 26.4 | 24.4 | 3.5 | 33.4 | 5.3 | 35.2 | 35.2 | 42.2 |
| Lead oxide (g/l) | 7 | 2 | 7 | 5 | | | | | | | | | | |
| Lead perchlorate (g/l) | 6.4 | 1.8 | 6.4 | 4.6 | 41.4 | 37.7 | 32.2 | 36.8 | 4 | 10 | 15 | 82 | 89 | 100 |
| As lead (g/l) | | | | | | | | | 2.0 | 4.5 | 6.8 | 36.9 | 40.0 | 45.0 |
| Perchloric acid (g/l) | 16 | 10 | 15 | 90 | 100 | 95 | 80 | 75 | 10 | 85 | 18 | 90 | 75 | 80 |
| Perchloric acid component (g/l) | 16 | 10 | 15 | 90 | 100 | 95 | 80 | 75 | 19 | 90 | 15 | 135 | 107 | 115 |
| Thiourea (g/l) | 27 | 30 | 35 | 40 | 45 | 40 | 45 | 35 | 20 | 28 | 30 | 40 | 45 | 50 |
| Plating conditions | | | | | | | | | | | | | | |
| Temperature (°C.) | 65 | 65 | 70 | 70 | 75 | 65 | 70 | 75 | 70 | 70 | 65 | 65 | 75 | 70 |
| pH | 0.7 | 0.7 | 0.7 | 0.8 | 0.8 | 0.8 | 0.8 | 0.8 | 0.8 | 0.8 | 0.8 | 0 | 0 | 0.7 |
| Plating time (minutes) | 10 | 10 | 10 | 15 | 15 | 15 | 20 | 20 | 10 | 10 | 15 | 15 | 20 | 20 |
| Formed coat | | | | | | | | | | | | | | |
| Thickness (μm) | 2.8 | 2.7 | 2.5 | 3.1 | 3.5 | 4 | 4.2 | 3.9 | 2.5 | 3.2 | 3.5 | 4.4 | 3.9 | 4.0 |
| Tin ratio (%) | 47.2 | 35.6 | 46.6 | 89.5 | 92.1 | 90.3 | 81.4 | 79.9 | 49.1 | 40.4 | 38.6 | 82.7 | 79.3 | 85.6 |
| Dissolution test | x | x | x | x | x | x | Δ | Δ | x | x | x | Δ | Δ | Δ |
| Short circuit test | o | o | o | o | o | o | o | o | o | o | o | o | o | o |
| Resist test | | | | | | | | | | | | | | |
| Appearance | o | o | o | o | o | o | o | o | o | o | o | o | o | o |
| Pencil hardness | 8H | 8H | 8H | 7H | 8H | 7H | 7H | 8H | 8H | 7H | 8H | 8H | 8H | 8H |
| Peel test | o | o | o | o | o | o | o | o | o | o | o | o | o | o |
| Durability to resist solder | o | o | o | o | o | o | o | o | o | o | o | o | o | o |

TABLE 3-continued

| Comparative Experiment No. | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Kind of resist | A | B | A | B | A | B | A | B | A | B | A | B | A | B |

A: Photographic development type liquid resist
B: Thermosetting type solder resist

COMPARATIVE EXPERIMENTS 15 TO 19

The same printed substrate as used in the working examples was subjected to electroless plating using various known electroless plating bath composition. The coat consequently formed was subjected to the same tests as in the working examples. The plating conditions and the test results are shown in Table 4.

TABLE 4

| Comparative Experiment No. | 15 | 16 | 17 | 18 | 19 |
|---|---|---|---|---|---|
| Plating bath composition | | | | | |
| Borofluoric acid (ml/l) | 45 | 45 | 90 | 90 | — |
| Stannous borofluoride (g/l) | 30 | 30 | 30 | 30 | 30 |
| Lead borofluoride (g/l) | 15 | 15 | 10 | 10 | 20 |
| Thiourea (g/l) | 130 | 130 | 130 | 130 | 70 |
| Sodium hypophosphate (g/l) | 50 | 50 | 50 | 50 | — |
| Sodium ethylenediaminetetracetate (g/l) | 15 | 15 | 10 | 10 | — |
| Surfactant (g/l) | 0.5 | 0.5 | 0.5 | 0.5 | — |
| Plating conditions | | | | | |
| Temperature (°C.) | 85 | 85 | 80 | 80 | 60 |
| pH | 1.2 | 1.2 | 1.0 | 1.0 | 2.1 |
| Plating time (minutes) | 5 | 15 | 5 | 10 | 60 |
| Formed coat | | | | | |
| Thickness (μm) | 1.9 | 2.8 | 2.3 | 2.7 | 5.3 |
| Tin ratio (%) | 76.2 | 77.6 | 82.2 | 83.4 | 54.3 |
| Dissolution test | Δ | Δ | Δ | Δ | x |
| Short circuit test | c | c | c | c | o |
| Resist test | | | | | |
| Appearance | Δ | Δ | x | x | o |
| Pencil hardness | 3H | 3H | 2H | 2H | 4H |
| Peel test | x | x | x | x | x |
| Durability to resist solder | x | x | x | x | Δ |
| Kind of resist | A | B | A | B | A |

A: Photographic development type liquid resist
B: Thermosetting type solder resist Tables 1, 2, 3 and 4 clearly show that the bath compositions of this invention containing perchloric acid were markedly better for practical use as a tin-lead electroless plating bath.

What is claimed is:

1. An electroless plating bath composition for plating a substrate provided with a resist film, said bath produced by mixing sufficient amounts of:
   (a) stannous oxide,
   (b) at least one member selected from the group consisting of lead oxide and lead perchlorate,
   (c) perchloric acid and
   (d) thiorea such that the bath concentration of tin is from 6 to 22 g/l, the bath concentration of lead is from 8 to 30 g/l, the bath concentration of perchloric acid is from 19 to 58 g/l and the bath concentration of thiourea is from 20 to 70 g/l.

2. A method for the production of an electroless plating bath composition for plating a substrate provided with a resist film comprising the step of mixing sufficient amounts of:
   (a) stannous oxide,
   (b) at least one member selected from the group consisting of lead oxide and lead perchlorate,
   (c) perchloric acid and
   (d) thiourea such that the bath concentration of tin is from 6 to 22 g/l, the bath concentration of lead is form 8 to 30 g/l, the bath concentration of perchloric acid is from 19 to 58 g/l and the bath concentration of thiourea is from 20 to 70 g/l.

* * * * *